(12) United States Patent
Kolsrud

(10) Patent No.: US 6,268,814 B1
(45) Date of Patent: Jul. 31, 2001

(54) CARRIER-DEPENDENT DITHERING FOR ANALOG-TO-DIGITAL CONVERSION

(75) Inventor: Arild T. Kolsrud, Bridgewater, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/524,152

(22) Filed: Mar. 14, 2000

(51) Int. Cl.[7] .................................................. H03M 1/20
(52) U.S. Cl. ............................................. 341/131; 341/155
(58) Field of Search ...................................... 341/131, 155

(56) References Cited

U.S. PATENT DOCUMENTS

| | | | |
|---|---|---|---|
| 5,252,973 | * | 10/1993 | Masuda ................................. 341/131 |
| 5,493,298 | * | 2/1996 | Bartz . |
| 5,940,138 | * | 8/1999 | Lowe .................................... 341/131 |
| 5,963,157 | * | 10/1999 | Smith ................................... 341/131 |
| 6,016,113 | * | 1/2000 | Binder .................................. 341/131 |
| 6,064,328 | * | 5/2000 | Scheidig et al. ..................... 341/131 |

* cited by examiner

Primary Examiner—Trong Phan
(74) Attorney, Agent, or Firm—Steve Mendelsohn

(57) ABSTRACT

An analog-to-digital converter (ADC) includes a dither signal generator configured to add an analog dither signal to the analog input signal of the ADC prior to digitization (i.e., quantization). The amplitude of the dither signal is selected based upon the power levels of one or more carriers present in the bandwidth for which the ADC is designed to operate. Addition of the dither signal to the input signal in the analog domain reduces quantization noise such as conversion spurs that result from non-linearities in the ADC transfer function.

18 Claims, 3 Drawing Sheets

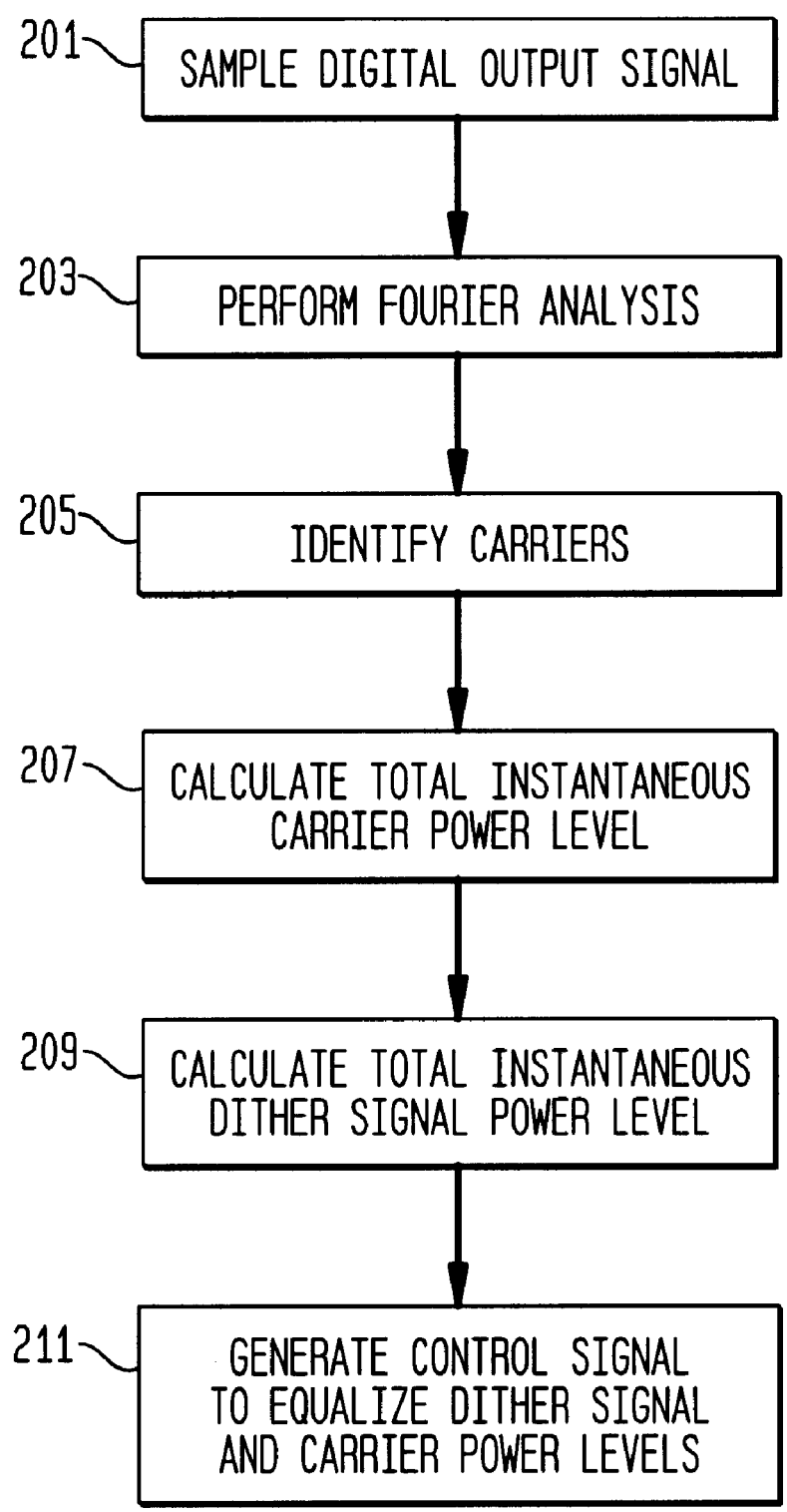

CARRIER-DEPENDENT DITHERING FOR ANALOG-TO-DIGITAL CONVERSION

BACKGROUND OF THE INVENTION

1. Field of the Invention

The present invention relates generally to analog-to-digital converters and, more particularly, relates to a technique for improving the accuracy of an analog-to-digital converter.

2. Description of the Related Art

Digital processing of analog signals becomes an increasingly attractive alternative to analog processing as digital hardware becomes increasingly faster, more sophisticated, and more integrated. Also, digital systems are, in general, inherently more flexible and less sensitive to time and temperature fluctuations than analog systems. As a result, a great effort has gone into the development of analog-to-digital converters (ADCs) for transforming an analog signal to a digital representation of that signal with ever-increasing accuracy, speed, and resolution.

Analog-to-digital conversion involves amplitude quantization, where an analog input signal, which may vary continuously over a finite amplitude range, is sampled at a uniform sampling rate to map the analog input signal to a finite number of discrete amplitudes. The input signal dynamic range of an ADC is divided into a specified number of possible discrete amplitudes (i.e., quantization levels), where the number of discrete amplitude levels specifies the resolution of the ADC. For example, an ADC having $2^m$ quantization levels generates an m-bit digital output signal, where the value of m defines the resolution of the ADC.

Another important characteristic of an ADC is its linearity (or accuracy), which is a measure of the variance, from a straight line, of the ADC transfer function, i.e., the characteristic mapping of the input signal to the corresponding output signal. Non-linearity in an ADC transfer function typically results in conversion spurs, which are fictitious signals appearing in the frequency domain (e.g., during fast Fourier transform (FFT) analysis) of signals having discontinuities that are associated with deviations from a purely linear response. Most existing techniques for increasing the accuracy of an ADC rely on analog domain methods to minimize the error due to the presence of internal and external noise sources, and to maximize the accuracy and the time and temperature stability of the analog components in the ADC.

For many applications, such as telecommunications, it is important to have low noise at steady state in the absence of an input signal, and a high signal-to-noise ratio when an input signal containing one or more carriers is present at the ADC. Accordingly, it would be useful to provide an improved ADC that reduces the conversion spurs associated with non-linearity of the ADC transfer function.

SUMMARY OF THE INVENTION

The present invention is directed to a technique for increasing the accuracy of an ADC. According to embodiments of the present invention, an analog dither signal is added to the analog input signal prior to amplitude quantization. The dither signal of the present invention has a variable amplitude that is controlled by a processor that analyzes the quantized digital representations of the dithered input signal to determine the appropriate amplitude for the dither signal to be added to the analog input signal. The amplitude of the dither signal is based on the power levels of one or more carriers present in the analog input signal. The addition of the dither signal reduces unwanted conversion spurs caused by non-linearities in the ADC transfer function.

In one embodiment, the present invention is an analog-to-digital converter (ADC) for converting an analog input signal into a digital output signal, comprising (a) a dither signal generator, configured to generate an analog dither signal; (b) a signal coupler, configured to add the analog dither signal to the analog input signal to generate a dithered analog signal; (c) an amplitude quantizer, configured to digitize the dithered analog signal to generate the digital output signal; and (d) a processor, configured to analyze the digital output signal to generate a control signal for controlling the amplitude of the dither signal generated by the dither signal generator, wherein the processor generates the control signal based on a measure of total instantaneous power level of one or more carriers in the analog input signal.

In another embodiment, the present invention is a method for converting an analog input signal into a digital output signal, comprising the steps of (a) generating an analog dither signal; (b) adding the analog dither signal to the analog input signal to generate a dithered analog signal; (c) digitizing the dithered analog signal to generate the digital output signal; and (d) analyze the digital output signal to generate a control signal for controlling the amplitude of the dither signal, wherein the control signal is based on a measure of total instantaneous power level of one or more carriers in the analog input signal.

BRIEF DESCRIPTION OF THE DRAWINGS

Other aspects, features, and advantages of the present invention will become more fully apparent from the following detailed description, the appended claims, and the accompanying drawings in which:

FIG. 2 shows a flow chart of the processing implemented by the processor of FIG. 1 to generate the VGA control signal used to control the amplitude of the dither signal, according to one embodiment of the present invention.

DETAILED DESCRIPTION

Figure 1:
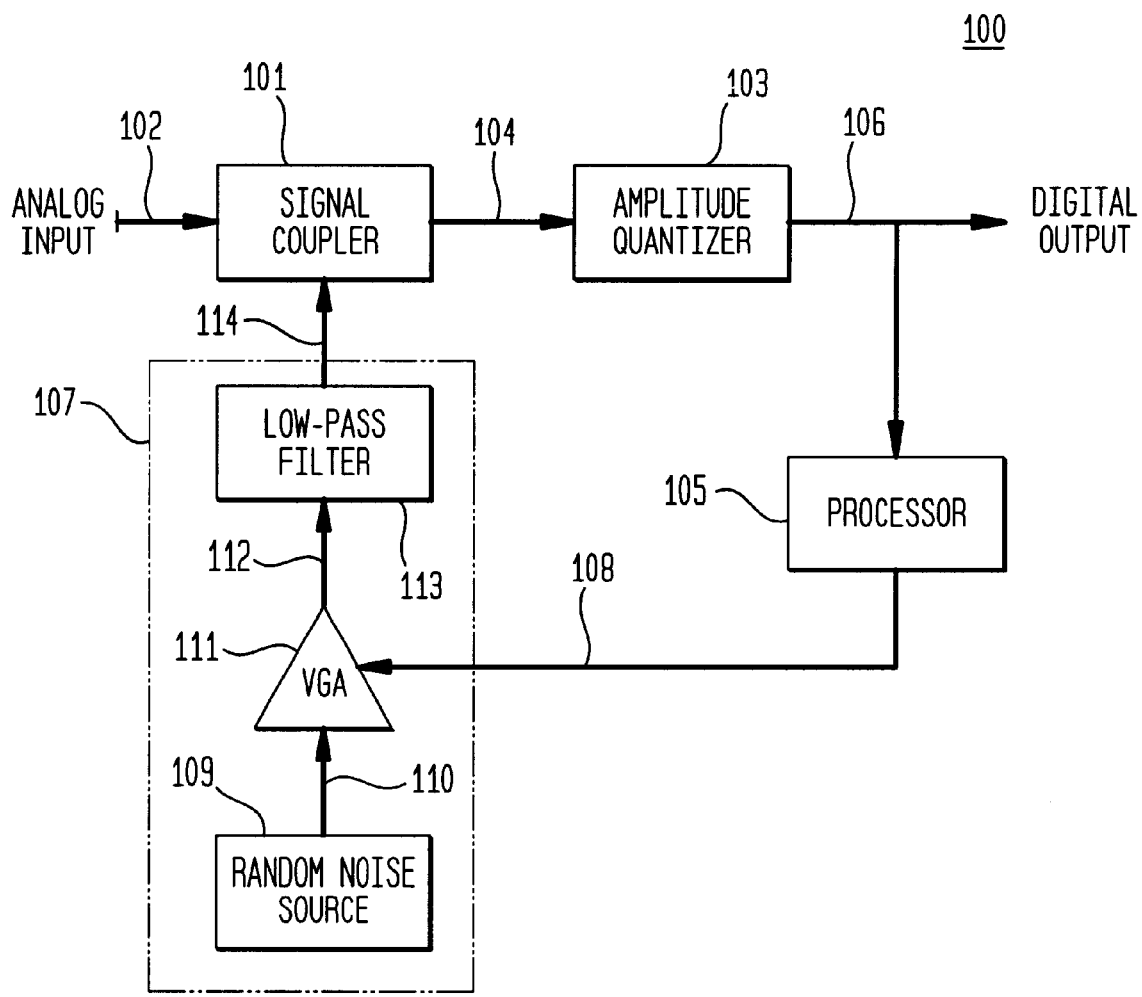
FIG. 1 is a block diagram of an analog-to-digital converter, according to one embodiment of the present invention.

Referring to FIG. 1, an analog-to-digital converter (ADC) 100 comprises a signal coupler 101, an amplitude quantizer 103, a processor 105, and a dither signal generator 107. In general, ADC 100 converts an analog input signal 102 into a digital output signal 106. In particular, signal coupler 101 adds an analog dither signal 114 generated by dither signal generator 107 to the analog input signal 102. The resulting dithered analog signal 104 is quantized by amplitude quantizer 103 to generate the digital output signal 106. Processor 105 analyzes the digital output signal 106 to generate a control signal 108 used to control the amplitude of the analog dither signal 114 generated by dither signal generator 107. The purpose of adding the dither signal 114 is to ensure that the resulting dithered analog signal 104 is an uncorrelated signal such that the digital output signal 106 has reduced conversion spurs due to non-linearity in the ADC transfer function.

Signal coupler 101 may be any suitable component for adding the analog dither signal 114 to the analog input signal 102, such as a passive component like a resistive or Wilkinson power divider or a directional or hybrid coupler, or an active component like a dual-gate FET or other transistor-based adder. Amplitude quantizer 103 may be any suitable component for quantizing a high-frequency analog signal. The sampling frequency of amplitude quantizer 103 should be at least two times the high-frequency limit of the ADC operational bandwidth. Processor 105 is any suitable digital processor, such as a digital signal processor (DSP) or a programmable logic device (PLD). In a preferred implementation, ADC 100 is implemented as a single integrated circuit, although discrete-element implementations are also possible.

As shown in FIG. 1, dither signal generator 107 comprises a random noise source 109, a variable gain amplifier (VGA) 111, and a low-pass filter 113. Random noise source 109 generates an analog random noise signal 110. Depending on the implementation, random noise source 109 may be based on one or more pseudo-random noise generators controlled by one or more digital circuits to generate digitally created noise, or it may be based on an analog noise source, such as a noise diode. In either case, VGA 111 amplifies the analog random noise signal 110 from random noise source 109 to generate an amplified analog noise signal 112. The gain of VGA 111 is controlled by the control signal 108 from processor 105.

Low-pass filter 113 filters the amplified analog noise signal 112 from VGA 111 to generate the analog dither signal 114 for input to signal coupler 101. Depending on the implementation, low-pass filter 113 preferably limits the frequency of the analog dither signal to be a small fraction of the Nyquist tone for the bandwidth of ADC 100. For example, when ADC 100 is designed to operate in the range from about 10–20 MHZ up to about 500 MHZ (or higher), low-pass filter 113 limits the frequency of the analog dither signal 114 to less than about 1 MHZ (i.e., about 1/20 to 1/10 of the low-frequency limit of the ADC operational bandwidth).

Processor 105 processes every no value in the digital output signal 106, where $n^{th}$ is a positive integer, to identify and characterize the carriers that are present in the analog input signal 102 to generate the VGA control signal 108. The amplitude of the dither signal 114 preferably corresponds to the sum of the power levels of the one or more carriers present within the ADC's operational bandwidth.

FIG. 2 shows a flow chart of the processing implemented by processor 105 of FIG. 1 to generate the control signal 108 used to control VGA 111, according to one embodiment of the present invention. Processor 105 samples the digital output signal 106 (step 201 of FIG. 2) and applies Fourier analysis (e.g., an FFT) to the sampled digital output signal (step 203). The low-frequency bins resulting from the FFT correspond to the dither signal 114, while the high-frequency FFT bins correspond to the input signal 102. Processor 105 identifies each carrier in the input signal 102 as a significantly large peak in the magnitudes of the values maintained in the high-frequency FFT bins (step 205). This identification includes an identification of FFT bins corresponding to the low-frequency and high-frequency limits for each carrier, e.g., by thresholding the bin magnitude levels at a specified magnitude level or percentage of the carrier peak magnitude level.

Processor 105 uses the results of the FFT analysis to calculate the total instantaneous power levels of the identified carriers in the input signal 102 and of the dither signal 114 (steps 207 and 209, respectively). The total instantaneous carrier power level $S_T(t)$ of the carriers in the input signal 102 is given by Equation (1) as follows:

$$S_T(t) = \sum_{i=1}^{N} \int_{f_{low}}^{f_{high}} S_i(f) df \qquad (1)$$

where:
  N is the number of different identified carriers (i.e., the number of significantly large peaks in the high-frequency FFT bins);
  $f_{low}$ is the low-frequency limit for the $i^{th}$ carrier;
  $f_{high}$ is the high-frequency limit for the $i^{th}$ carrier; and
  $S_i(f)$ is the amplitude of the $i^{th}$ carrier at frequency f (i.e., the magnitude of the value in the corresponding FFT bin).

Similarly, the total instantaneous dither signal power D(t) is given by Equation (2) as follows:

$$D(t) = \int_0^{f_{LPF}} d(f) df \qquad (2)$$

where:
  $f_{LPF}$ is the cut-off frequency of low-pass filter 113; and
  d(f) is the amplitude of the dither signal 114 at frequency f (i.e, the magnitude of the value in the corresponding FFT bin).

Processor 105 generates a value for control signal 108 in order to set the gain of VGA 111 to, for example, equalize the total instantaneous dither signal power level D(t) and the total instantaneous carrier power level $S_T(t)$ (step 211). The addition of such an dither signal 114 ensures that amplitude quantizer 103 sees a fairly uncorrelated signal power at the input so that the conversion spurs which result from non-linearities in the ADC transfer function will be reduced. By repeating the operations of processor 105 at frequent intervals, the amplitude of the dither signal 114 can be updated to maintain the quality of the ADC digital output signal 1106.

Figure 3A:
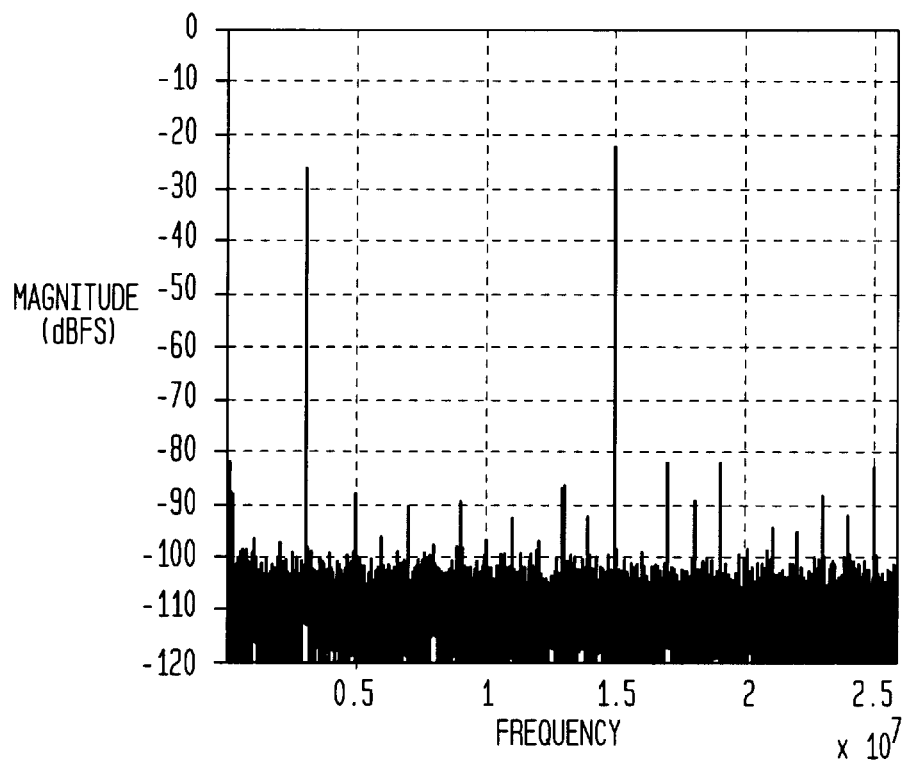
FIGS. 3A and 3B show exemplary test results indicating how the present invention can assist in reducing the effects of non-linearities in the ADC transfer function.
Figure 3B:
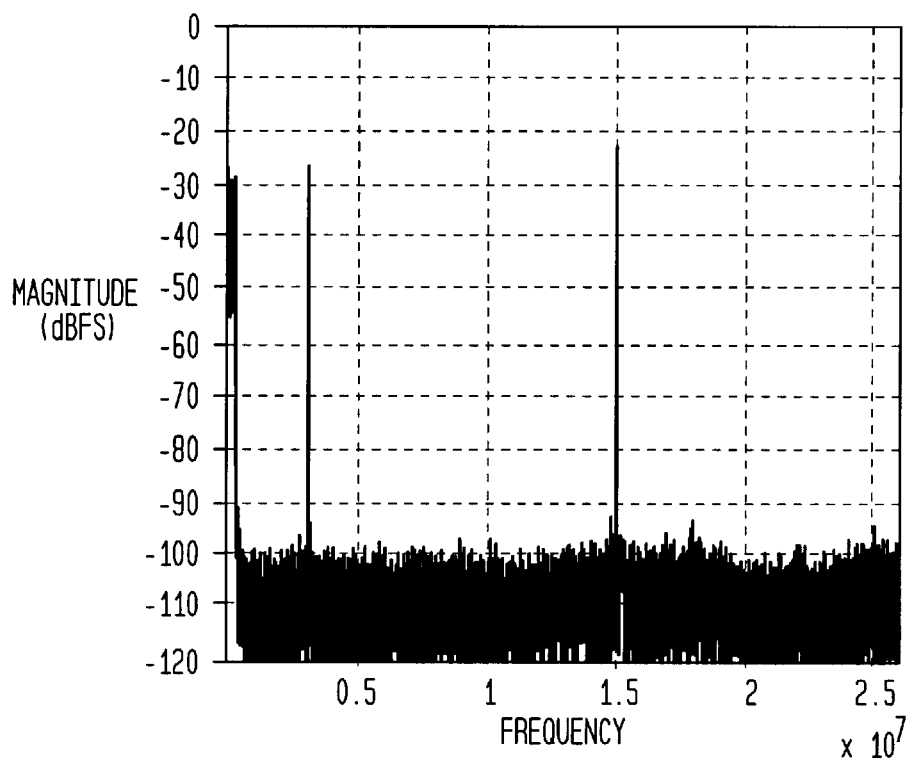

FIGS. 3A and 3B illustrate exemplary test results indicating how the dither signal of the present invention can assist in reducing the effects of non-linearity in an ADC transfer function. FIG. 3A illustrates the 32 k fast Fourier transform (FFT) analysis of the digital output signal generated by an ADC for an analog input signal having two different carriers (at about 3 MHZ and about 15 MHZ) without adding any dither signal. FIG. 3B illustrates a 32 k FFT analysis of the digital output signal generated by an ADC for the same analog input signal, where a dither signal in accordance with the present invention is added prior to quantization. As shown in the figures, the addition of the dither signal eliminates conversion spurs evident in FIG. 3A, corresponding to improved quality of the digitized output spectrum, as shown in FIG. 3B.

The present invention may be applied in a variety of applications, including ADCs for input signals having one or more RF carriers containing or un-correlated data, such as TDMA, GSM, or CDMA applications. Depending on the implementation, in these applications, the dither signal may be of a relatively smaller amplitude as compared to the RF carriers.

It will be understood that the above description is of the preferred exemplary embodiment of the invention, and that the invention is not limited to the specific forms shown. Various other substitutions, modifications, changes, and omissions may be made in the design and arrangement of the elements of the preferred embodiment without departing from the spirit of the invention as expressed in the appended claims.

What is claimed is:

1. An integrated circuit having an analog-to-digital converter (ADC) for converting an analog input signal into a digital output signal, the ADC comprising:

(a) a dither signal generator, configured to generate an analog dither signal;

(b) a signal coupler, configured to add the analog dither signal to the analog input signal to generate a dithered analog signal;

(c) an amplitude quantizer, configured to digitize the dithered analog signal to generate the digital output signal; and (d) a processor, configured to analyze the digital output signal to generate a control signal for controlling the amplitude of the dither signal generated by the dither signal generator, wherein the processor generates the control signal based on a measure of total instantaneous power level of one or more carriers in the analog input signal.

2. The invention of claim 1, wherein the dither signal generator comprises:

(1) a random noise source, configured to generate a random noise signal; and (2) a variable gain amplifier (VGA), configured to amplify the random noise signal from the random noise source based on the control signal from the processor to generate the analog dither signal.

3. The invention of claim 2, wherein the dither signal generator further comprises a low-pass filter configured to filter the analog dither signal prior to addition with the analog input signal at the signal coupler.

4. The invention of claim 1, wherein the processor characterizes instantaneous power level of each individual carrier and then sums the instantaneous power levels of the individual carriers to generate the total instantaneous power level.

5. The invention of claim 4, wherein the processor characterizes the instantaneous power level of an individual carrier by summing power levels at a plurality of frequencies within a frequency range for the corresponding individual carrier.

6. The invention of claim 1, wherein the processor periodically re-analyzes the digital output signal to update the control signal.

7. An analog-to-digital converter (ADC) for converting an analog input signal into a digital output signal, comprising:

(a) a dither signal generator, configured to generate an analog dither signal;

(b) a signal coupler, configured to add the analog dither signal to the analog input signal to generate a dithered analog signal;

(c) an amplitude quantizer, configured to digitize the dithered analog signal to generate the digital output signal; and (d) a processor, configured to analyze the digital output signal to generate a control signal for controlling the amplitude of the analog dither signal generated by the dither signal generator, wherein the processor generates the control signal based on a measure of total instantaneous power level of one or more carriers in the analog input signal.

8. The invention of claim 7, wherein the dither signal generator comprises:

(1) a random noise source, configured to generate a random noise signal; and (2) a variable gain amplifier (VGA), configured to amplify the random noise signal from the random noise source based on the control signal from the processor to generate the analog dither signal.

9. The invention of claim 8, wherein the dither signal generator further comprises a low-pass filter configured to filter the analog dither signal prior to addition with the analog input signal at the signal coupler.

10. The invention of claim 7, wherein the processor characterizes instantaneous power level of each individual carrier and then sums the instantaneous power levels of the individual carriers to generate the total instantaneous power level.

11. The invention of claim 10, wherein the processor characterizes the instantaneous power level of an individual carrier by summing power levels at a plurality of frequencies within a frequency range for the corresponding individual carrier.

12. The invention of claim 7, wherein the processor periodically re-analyzes the digital output signal to update the control signal.

13. A method for converting an analog input signal into a digital output signal, comprising the steps of:

(a) generating an analog dither signal;

(b) adding the analog dither signal to the analog input signal to generate a dithered analog signal;

(c) digitizing the dithered analog signal to generate the digital output signal; and (d) analyze the digital output signal to generate a control signal for controlling the amplitude of the dither signal, wherein the control signal is based on a measure of total instantaneous power level of one or more carriers in the analog input signal.

14. The invention of claim 13, wherein step (a) comprises the steps of:

(1) generating a random noise signal; and (2) amplifying the random noise signal based on the control signal to generate the analog dither signal.

15. The invention of claim 14, wherein step (a) further comprises the step of low-pass filtering the analog dither signal prior to addition with the analog input signal.

16. The invention of claim 13, wherein step (d) comprises the steps of characterizing instantaneous power level of each individual carrier and then summing the instantaneous power levels of the individual carriers to generate the total instantaneous power level.

17. The invention of claim 16, wherein step (d) comprises the step of characterizing the instantaneous power level of an individual carrier by summing power levels at a plurality of frequencies within a frequency range for the corresponding individual carrier.

18. The invention of claim 13, wherein step (d) is repeated periodically to update the control signal.

* * * * *